United States Patent
Collins, Jr.

(10) Patent No.: US 7,062,734 B2
(45) Date of Patent: Jun. 13, 2006

(54) SLACK TIME ANALYSIS THROUGH LATCHES ON A CIRCUIT DESIGN

(76) Inventor: Truman Wesley Collins, Jr., 432 Country Club Rd., Lake Oswego, OR (US) 97034

( * ) Notice: Subject to any disclaimer, the term of this patent is extended or adjusted under 35 U.S.C. 154(b) by 10 days.

(21) Appl. No.: 10/319,018

(22) Filed: Dec. 12, 2002

(65) Prior Publication Data
US 2003/0192020 A1    Oct. 9, 2003

Related U.S. Application Data

(60) Provisional application No. 60/370,805, filed on Apr. 5, 2002.

(51) Int. Cl.
*G06F 17/50* (2006.01)

(52) U.S. Cl. .................. 716/6; 716/4; 716/5

(58) Field of Classification Search ............. 716/4–6; 714/32–37; 703/14–16, 19
See application file for complete search history.

(56) References Cited

U.S. PATENT DOCUMENTS

| | | | | |
|---|---|---|---|---|
| 4,763,289 A * | 8/1988 | Barzilai et al. ............. | 703/2 |
| 5,218,551 A * | 6/1993 | Agrawal et al. ............ | 716/10 |
| 5,365,463 A * | 11/1994 | Donath et al. ............. | 703/19 |
| 5,404,360 A * | 4/1995 | Suzuki et al. .............. | 714/27 |
| 5,740,347 A * | 4/1998 | Avidan ...................... | 714/33 |
| 5,790,830 A * | 8/1998 | Segal ......................... | 706/6 |
| 5,864,487 A * | 1/1999 | Merryman et al. ......... | 716/6 |
| 5,894,419 A * | 4/1999 | Galambos et al. .......... | 716/6 |
| 6,158,022 A * | 12/2000 | Avidan ...................... | 714/33 |
| 6,185,723 B1 * | 2/2001 | Burks et al. ................ | 716/6 |
| 6,401,231 B1 | 6/2002 | Belkhale et al. | |
| 6,438,731 B1 * | 8/2002 | Segal ......................... | 716/2 |
| 6,442,739 B1 * | 8/2002 | Palermo et al. ............ | 716/6 |
| 6,496,972 B1 * | 12/2002 | Segal ......................... | 716/18 |
| 6,604,227 B1 * | 8/2003 | Foltin et al. ................ | 716/6 |
| 6,611,948 B1 * | 8/2003 | Tyler et al. ................. | 716/6 |
| 6,678,644 B1 * | 1/2004 | Segal ......................... | 703/15 |

OTHER PUBLICATIONS

IBM® website, www.http://houns54.clearlake.ibm.com, *"EinsTimer: Timing Analysis"*, 2003.

* cited by examiner

*Primary Examiner*—Stacy A. Whitmore
*Assistant Examiner*—Naum B Levin
(74) *Attorney, Agent, or Firm*—Klarquist Sparkman, LLP

(57) ABSTRACT

Slack times at an input of a latch in a circuit design are determined by determining a set of required times at the input of the latch, where the set of required times includes a required time entry for each different relationship between a signal comprising a downstream event and a clock signal for the latch. A set of arrival time entries at the input of the latch is also determined, each arrival time entry having a corresponding required time entry.

30 Claims, 15 Drawing Sheets

SLACK TIME ANALYSIS THROUGH LATCHES ON A CIRCUIT DESIGN

CROSS REFERENCE TO RELATED APPLICATIONS

This patent application claims priority to U.S. Provisional Patent Application No. 60/370,805, filed on Apr. 5, 2002, and entitled "SLACK TIME ANALYSIS ON A CIRCUIT DESIGN", which is incorporated herein by reference.

FIELD

The invention relates to methods of deriving timing information for circuits, and more particularly to deriving slack times in circuits comprising latches.

BACKGROUND

Flip-flops and latches are common elements of circuits. A flip-flop receives a data signal on an input data terminal. The input data terminal is typically denoted by the symbol D. Upon receiving a clock signal on a clock terminal, the flip-flop stores (latches) the data signal and provides the data signal on an output data terminal. The clock terminal is typically denoted by the symbol CK, and the output data terminal is typically denoted by the symbol Q. The data signal is latched upon the occurrence of an edge of the clock signal. Herein, the terms "terminal" and "pin" may be considered interchangeable.

A latch operates in a manner similar to a flip-flop, except that the latch is "open" during substantially the entire interval while the clock signal is asserted. In other words, for a latch, the signal propagates from D through the latch to Q during substantially the entire time while the clock signal is asserted. When the clock signal is no longer asserted, the latch "closes", e.g. the signal from D is no longer propagated to Q. The Q terminal retains the value of the signal at D when the latch closed.

After the clock signal arrives at CK, the data signal must remain stable for the hold time in order for the data signal to be properly latched. This is true for both flip-flops and latches. Another consideration is the period of time during which the data signal must be stable before the clock signal arrives at CK. This is referred to as the setup time. The data signal must arrive at D and be stable there for a period of time equal to or exceeding the setup time in order for the data signal to be properly latched. Both flip-flops and latches are characterized by setup times.

For a flip-flop, the triggering edge of the clock signal is the clock signal edge that causes the flip-flop to latch the data signal. The triggering edge may be either the rising or falling edge of the clock signal. For a latch, the edge of the clock signal that causes the latch to open is referred to as the opening edge of the latch. The edge of the clock signal that causes the latch to close is referred to as the closing edge of the latch. The rising edge of the clock signal may serve as either the opening or closing edge of a latch. Likewise, the falling edge of the clock signal may serve as either the opening or closing edge of a latch.

Flip-flops and latches are clocked devices typically employed as sequential circuit elements. The timing of their operation is controlled by the timing of the clock signal. Non-clocked devices are also typically found in circuits. Such devices operate independently of a clock signal, and may be referred to collectively as "combinational" circuit elements. Examples of combinational elements include logic gates (AND, OR, inverter, NOR, NAND, etc. gates). Both clocked and combinational circuit elements have an associated propagation delay. The propagation delay of flip-flops and latches is the time that it takes the data signal to propagate from D to Q, once the clock signal is received at CK. The propagation delay of combinational elements, and collections thereof, is the time it takes for changes in the data signal(s) to the combinational elements to be reflected at the output(s) of the combinational elements.

A circuit element may be characterized by different propagation delays for high-low (falling) and low-high (rising) signal transitions. For example, an AND gate in a circuit may be characterized by a first input-to-output propagation delay for rising input signals, and second input-to-output propagation delay for falling input signals.

The propagation delay of a flip-flop is typically specified in terms of the time it takes a data signal at the D terminal to reach the Q terminal after the clock signal arrives at the CK terminal. This propagation delay may be referred to as the CK-Q delay of the flip-flop.

One propagation delay of a latch is typically specified in terms of the time it takes a data signal at the D terminal to reach the Q terminal after the opening clock edge arrives at the CK terminal. This propagation delay may be referred to as the CK-Q delay of the latch. The CK-Q delay of the latch may be employed in situations where the data signal arrives at the D terminal of a closed latch. Another propagation delay of a latch is typically specified in terms of the time it takes a data signal at the D terminal to reach the Q terminal when the data signal arrives at the D terminal of an open latch. This propagation delay may be referred to as the D-Q delay of the latch.

An important consideration for circuit designers is the tolerance for signal delays inherent in a circuit design. For example, in a circuit including a latch, it may be important for the circuit designer to know that the data signal arrives at D of the latch within the setup time of the latch, with five nanoseconds to spare. This spare time may be referred to as the "slack time" of the latch in the circuit in question. Among other things, the slack time for an element tells the designer whether the circuit design can tolerate additional delays in the data signal prior to the element. Where the slack time for an element is substantial, it may be possible for the circuit designer to insert additional or slower combinational logic before ("upstream" from) the element, or to rearrange the circuit design so that the slack time of the element is reduced by shifting the benefit of the slack time to parts of the design that come after ("downstream" from) the element. Herein, the term "upstream", in relation to a circuit element, refers to points in a circuit that a signal of interest reaches before it reaches the element. "Downstream" refers to points in the circuit that the signal reaches after it reaches the element.

A slack time may be positive, indicating that there is some spare time built into the timing. A slack time may also be negative, indicating that signals do not propagate in sufficient time to meet the timing requirements of the circuit.

Existing approaches to determining the slack time for latches have involved attempts to balance the slack time of the latch with the slack time of the next clocked element downstream from the latch. These approaches have proven problematic and have led to complex implementation code, misleading or unexpected slack times at points in the circuit, and confusing slack time reports.

SUMMARY

Slack times at an input of a latch in a circuit design are determined by determining a set of required times at the input of the latch, where the set of required times includes a required time entry for each different relationship between a signal comprising a downstream reference event and a clock signal for the latch. A set of arrival time entries at the input of the latch is also determined, each arrival time entry having a corresponding required time entry. The required times are propagated upstream from a final event of interest to a source event of interest. The arrival times are propagated downstream from the source event of interest to the final event of interest.

Slack path analysis on the circuit design is performed by organizing starting points of paths through the circuit design into a queue. Slack times are determined at the points, and the queue is ordered according to the slack times. A path having a lowest slack time is removed from the top of the queue. When the path is not complete, it is extended and a slack time is determined at a new end point of the path. The path is replaced at a location in the queue such that the queue remains ordered.

DRAWINGS

DESCRIPTION

Figure 1:
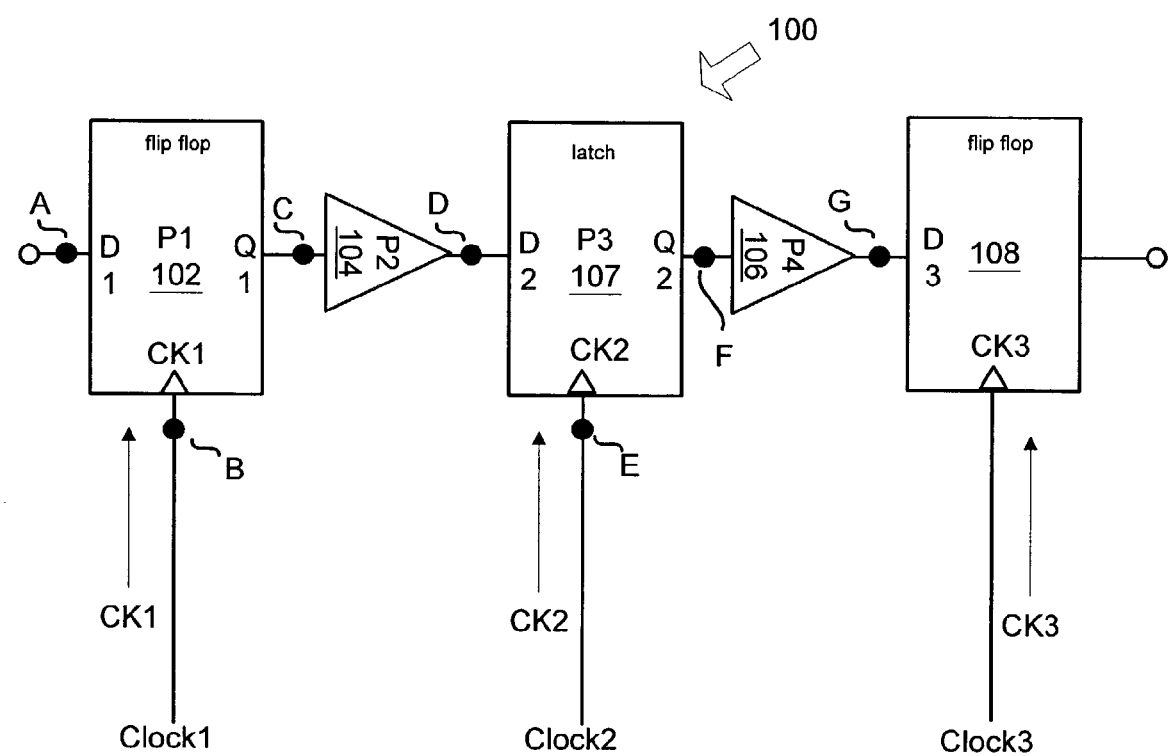
FIG. 1 is a block diagram of an embodiment of a circuit design.

With reference to the circuit embodiment 100 of FIG. 1, a first flip-flop 102 receives a signal S on input terminal D1. The flip-flop 102 receives a first clock signal edge C1 on clock terminal CK1. The output terminal Q1 of the flip-flop 102 is coupled to the input terminal D2 of the latch 107 by way of combinational logic 104. The combinational logic 104 is represented by a single symbol but may comprise numerous gates in various configurations. The latch 107 receives a second clock signal edge C2 on the clock terminal CK2. The output terminal Q2 of the latch 107 is coupled to the input terminal D3 of a second flip-flop 108 by way of combinational logic 106. Again, the combinational logic 106 is represented by a single symbol but may comprise numerous gates in various configurations. The flip-flop 108 receives a third clock signal edge C3 on clock terminal CK3.

Figure 2:
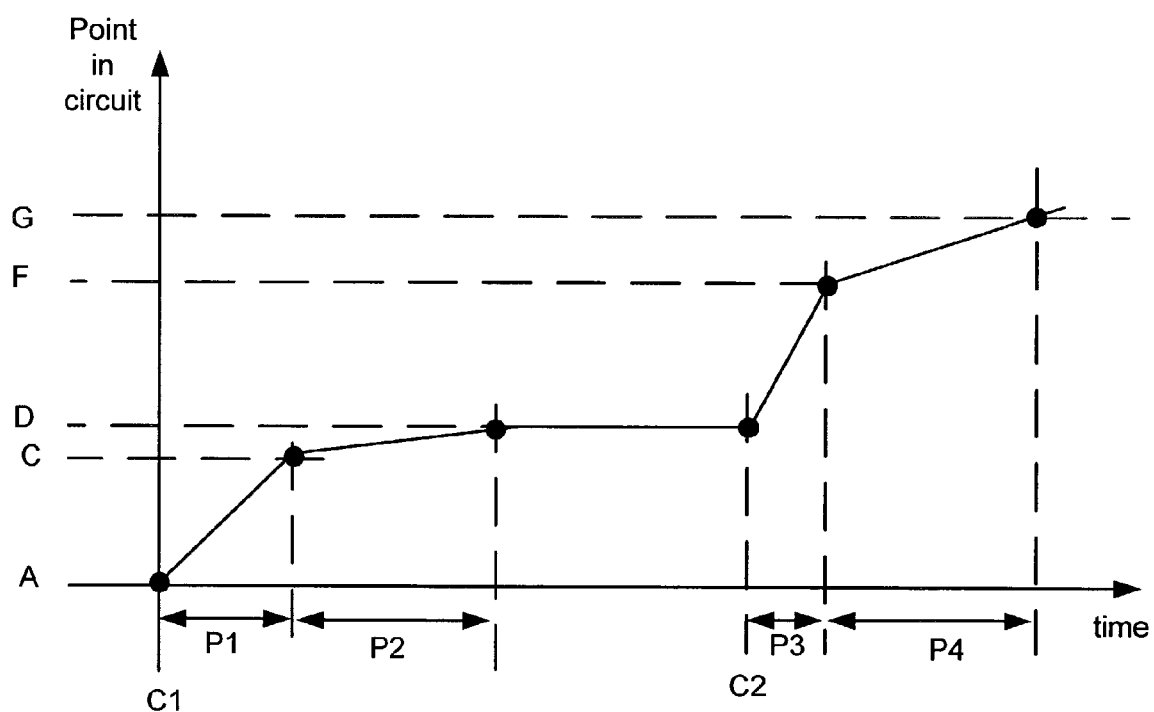
FIG. 2 is a graph of signal propagation through the circuit design of FIG. 1.

With respect to signal S, the first flip-flop 102 is upstream from the second flip-flop 108. The first flip-flop 102 may be referred to as the "source" flip-flop, and the second flip-flop 108 may be referred to as the "destination" flip-flop. With reference to FIG. 2, the signal S propagates over time through various points in the circuit. First, the signal S arrives at node A. Upon the occurrence of C1 at node B, S propagates through the flip-flop 102 to node C. Flip-flop 102 has a CK-Q propagation delay of P1, so that S arrives at C a time P1 after the occurrence of C1 at B.

Signal S then propagates from C to D, arriving at D after the propagation delay P2 of logic 104. Upon reaching point D, the signal S propagates to F after incurring the propagation delay P3 of the latch 107. The delay P3 to apply is either the CK-Q delay of the latch 107 (if the signal S arrives at D before the occurrence of clock signal C2 at E, e.g. when the latch 107 is closed), or else the delay is the D-Q delay if the signal S arrives at D after the clock signal C2, e.g. after the latch 107 opens. Signal S then propagates from F to G, arriving at G after the propagation delay P4 of the logic 106.

The propagation delays P1, P2, P3, and P4 may all vary according to whether or not the propagating event is a rising or falling edge of the signal S.

FIG. 2 illustrates only one of many possible timing scenarios for the circuit 100. Upon the occurrence of edge C1, S propagates from points A to C to D. The signal S is blocked at D (the input of the latch 107) until such time as the edge C2 occurs, at which point S propagates to point F and on to point G. Other timing scenarios are also possible. For example, depending upon the timing relationship between edges C1 and C2, the signal S may not be blocked at point D (the input of the latch 107), but may instead pass through the latch 107 without being blocked for any period of time. When a signal is blocked at the input of a latch, it is a "red light" condition. When a signal reaches the input of a latch and propagates through without being blocked for any period of time, it is a "green light" condition.

Figure 3:
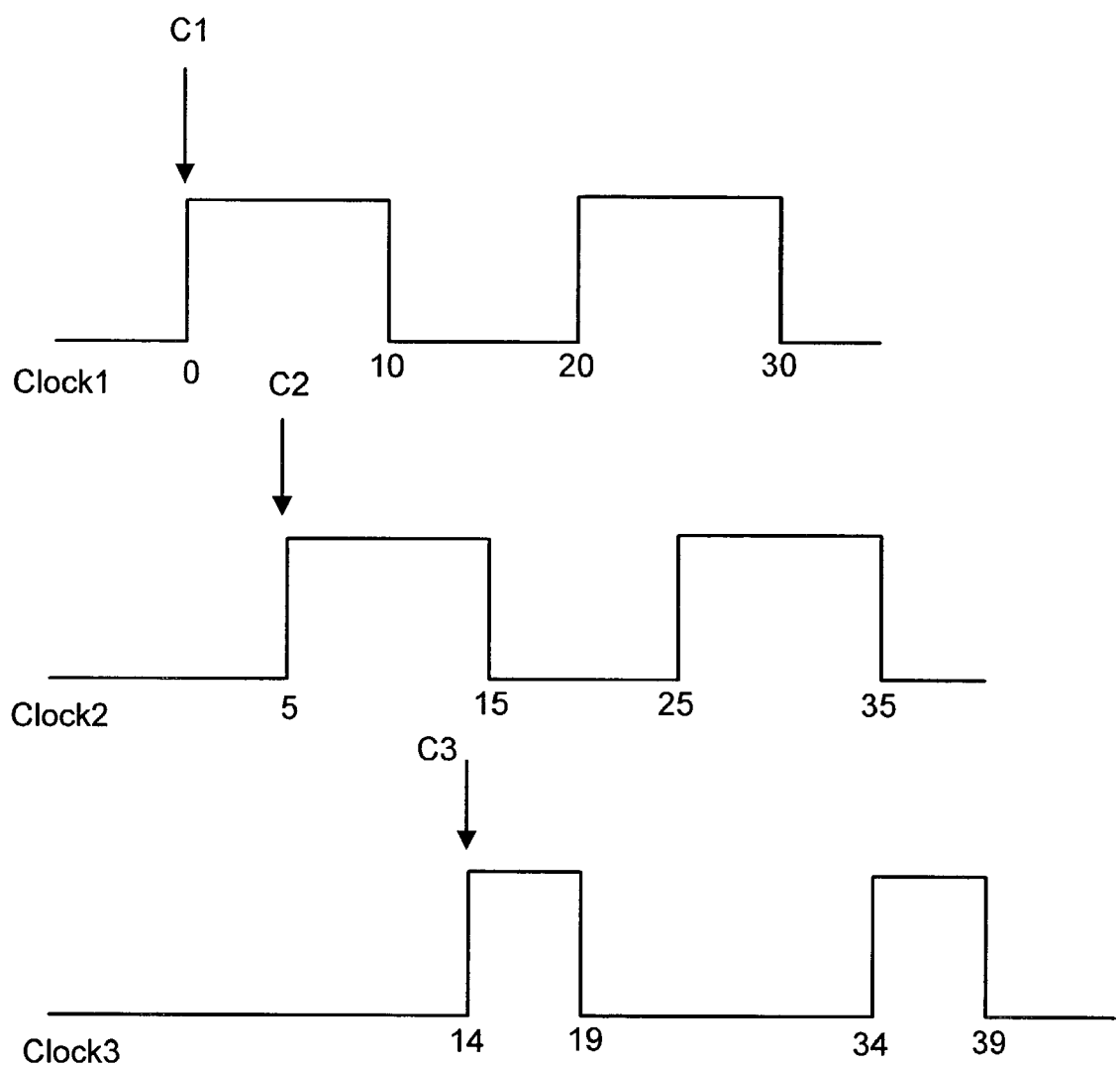
FIG. 3 illustrates embodiments of clock signals to the circuit design of FIG. 1.

FIG. 3 illustrates a possible timing relationship between the edges of three clock signals; Clock1, Clock2, and Clock3. The signal Clock1 has a period of 20 and is high from the time 0 to the time 10. Signal Clock1 is then low from time 10 to time 20. The signal Clock2 also has a period of 20, but is high from a time 5 to a time 15, and low from 15 to 25. The signal Clock3 has a period of 20 and is high from times 14 to 19, and low from times 19 to 34. Given this timing relationship among the clock signals, it is possible to compute slack times for points in the circuit 100 by assigning values to the various propagation delays of the elements.

Consider the situation where P1=0, P2=2 nanoseconds, P3=0, and P4=3 nanoseconds. Assume that the timing of the circuit requires that occurrence of edge C1 corresponds with the occurrence of edge C3. That is, a signal S that is propagated from point A (the input of the source flip-flop 102) upon the occurrence of edge C1 at time t=0 and must arrive at point G (the input of the destination flip-flop 108) prior to the occurrence of the edge C3 at time t=14. For purposes of simplifying the present discussion, the setup times for the latch 107 and the flip-flop 108 are ignored. At the occurrence of edge C1 (t=0), S begins to propagate downstream from A. Signal S can arrive at point D at any time prior or during the open interval of the latch 107 at t=5 and t=15 and still make it to point G before the occurrence of edge C3. Between times t=5 and t=15, the latch 107 is open and the signal S propagates through the latch 107. In the present example, signal S arrives at point D at t=2 and hits a red light until the occurrence of edge C2 at time t=5. At the occurrence of edge C2, the signal S propagates through the latch and arrives at point G at time t=8. The slack time at point G is the difference between when S actually arrives at point G, and the latest time S could have arrived at point G and still met the timing of the circuit. Thus the slack time at point G is:

14−8=6 nanoseconds.

Working backwards it is possible to determine the slack times at other points in the circuit. The slack time at F is (14−3)−5=6

The slack time at the clock terminal E of the latch 107 is (14−3)−5=6 nanoseconds (the CK-Q delay of the latch is assumed to be 0).

The slack time at the input terminal D of the latch 107 is

15−2=13, for reasons set forth in the following description.

A "path" is a set of related events at different points in a circuit. The points in a path are related by a common signal that passes through them without stopping. If a signal gets to a latch when it is closed, that path stops there. A new path starts at the enable pin when the latch opens. The slack time of a path is the slack time at the end of the path (the slack time as determined for the path at the final point in the path). Paths provide useful information about circuit timing behavior, including slack times at points in the circuit. To determine the slack times at points along a path, an event of interest is selected at the end point of the path. This event is referred to herein as the "final event of interest". In the preceding example, the final event of interest is the occurrence of the edge C3 at the flip-flop 108. At the start of the path, an event of interest is determined corresponding to the final event of interest. This corresponding event of interest is referred to herein as the "starting event of interest". In the preceding example, the starting event of interest is the occurrence of edge C1. For a specific path, the slack time will be the same at all the points.

Typically, the interval of time between the starting event of interest and the final event of interest bears upon the slack times at points along the path connecting the events. Thus, for events based upon periodic signals, it is important to examine all possible timing relationships between events comprised by the signals. In one embodiment, two periodic signals comprising the events of interest are "walked" in time to identify all possible relationships between the edges of the signals. For example, if the starting event of interest is a rising edge of a first clock signal, the first clock signal is traversed in time and each rising edge is examined against the corresponding (following most closely in time) rising edge of the second clock signal comprising the final event of interest. Each different timing relationship between the edges is recorded for purposes of determining slack times along the path between the events, when latches are involved. In a path without latches, only the timing relationship with the shortest time in between events is recorded, because that represents the worst slack time.

Figure 4:
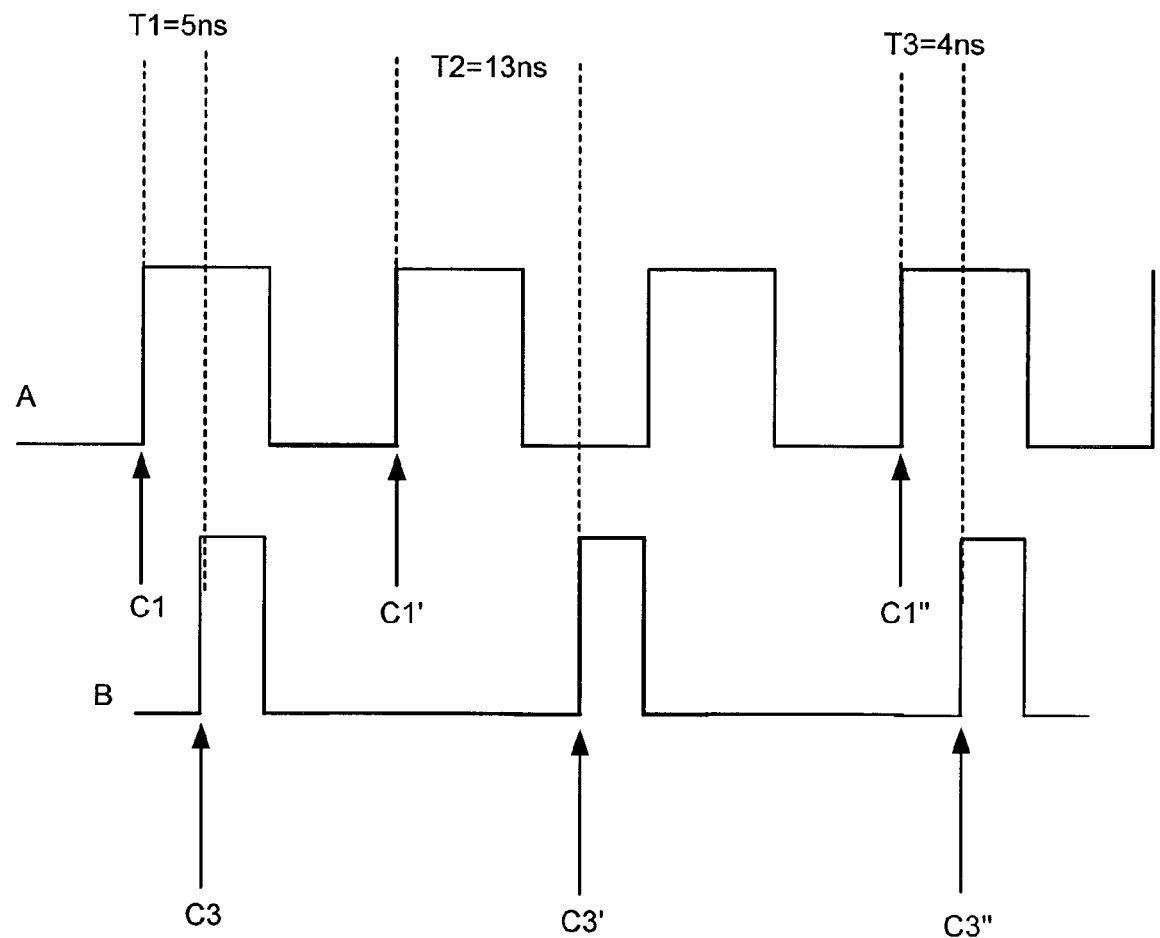
FIG. 4 illustrates embodiment of periodic signals having edges in multiple relationships.

Consider the pair of signal embodiments represented in FIG. 4. Both signals A and B are periodic. However, the signals have different periods, different duty cycles, and the edges of the signals are not coincident in time. Assume that there are no latches along the path to analyze. Choosing events (rising edges) C1' and C3' alone as the starting and final events of interest does not produce a worst-case analysis of setup slack times along the path, because T2 (the difference in time between edge C1' and edge C3') is larger than both T1 (the difference in time between edge C1 and edge C3) and T3 (the difference in time between edge C1" and edge C3"). Choosing events C1' and C3' alone is also insufficient because T1 is larger than T3. Choosing events C1" and C3" results in a slack time analysis that is worst-case of the three, because T3<T1<T2.

A more complicated situation arises when, as in the circuit embodiment 100 of FIG. 1, there are one or more latches 107 along the path between the starting and final events of interest. In this situation, the timing of the open intervals of the intervening latches becomes a consideration when determining the worst-case slack time of the path. The situation in which the latch clock signal and the destination flip-flop clock signal are closest in time may not lead to the worst-case slack situation for the path. Rather, a "back propagation" of required times for each possible relationship among the clocks may be performed, from the final event of interest to the source event of interest. In other words, starting with the required time of the final event of interest, required times are determined at successive neighboring points upstream in the path to keep track of possible relationships among the clocks encountered thus far.

Figure 5:
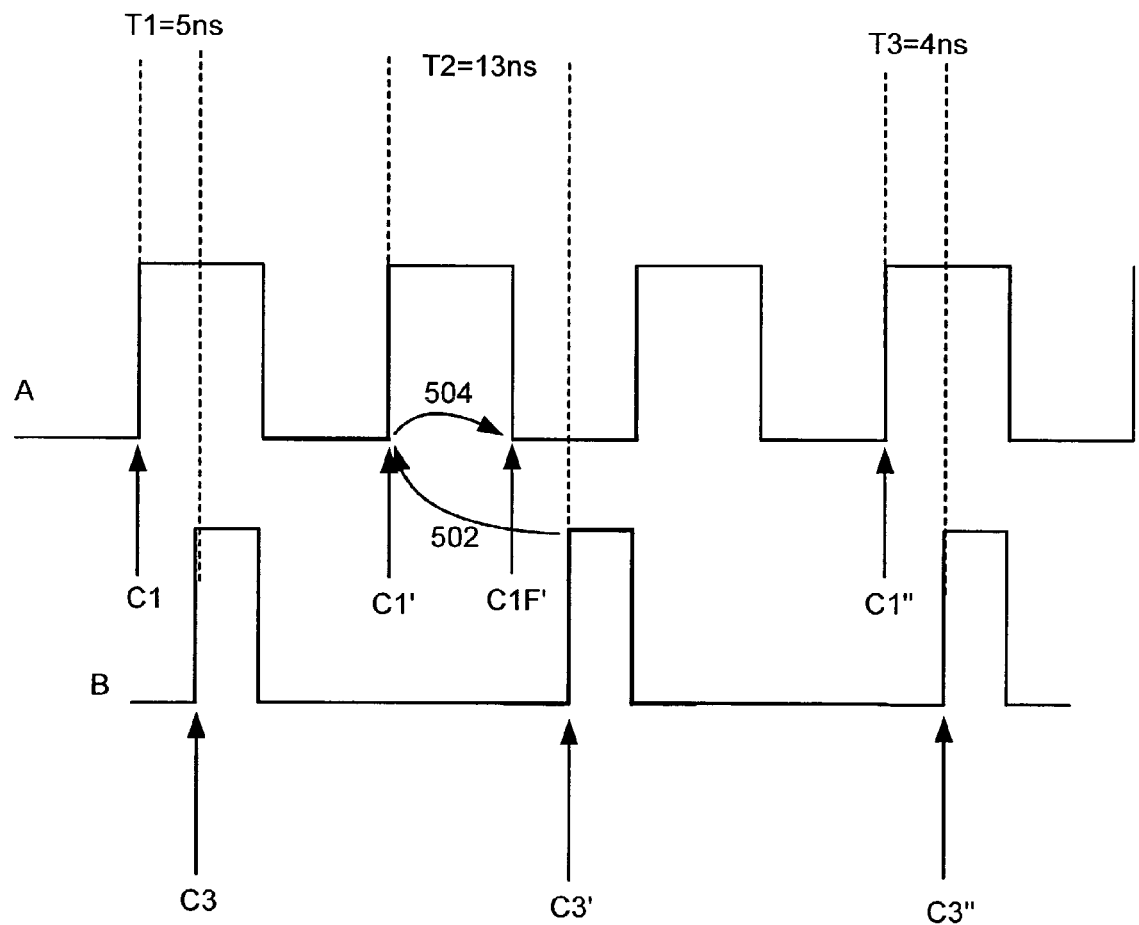
FIG. 5 illustrates a method embodiment to locate corresponding edges of periodic signals.

Consider the situation where the final event of interest is a rising (trigger) edge of Clock3, the clock signal to the destination flip-flop 108. The signal Clock3 is periodic. The rising edge selected as the final event of interest has a required time. During back propagation of this required time, the latch 107 is encountered between points D and F in the path. Recall that the latch 107 propagates the signal S from point D to point F during the interval when the latch clock signal, e.g. Clock2, is high. The required time for the signal S to reach point D (the D input terminal of the latch 107) occurs some time before the falling (closing) edge of Clock2 corresponding to the rising (trigger) edge of Clock3 that was selected as the final event of interest. A process known as "ping-pong" may be employed to identify an edge to reference this required time to. FIG. 5 illustrates the ping-pong process. At 502 the closest rising (opening) edge of Clock2 preceding the selected edge of Clock3 is selected (the 'ping'). At 504 the falling (closing) edge of Clock2 following this opening edge is determined (the 'pong').

Figure 6:
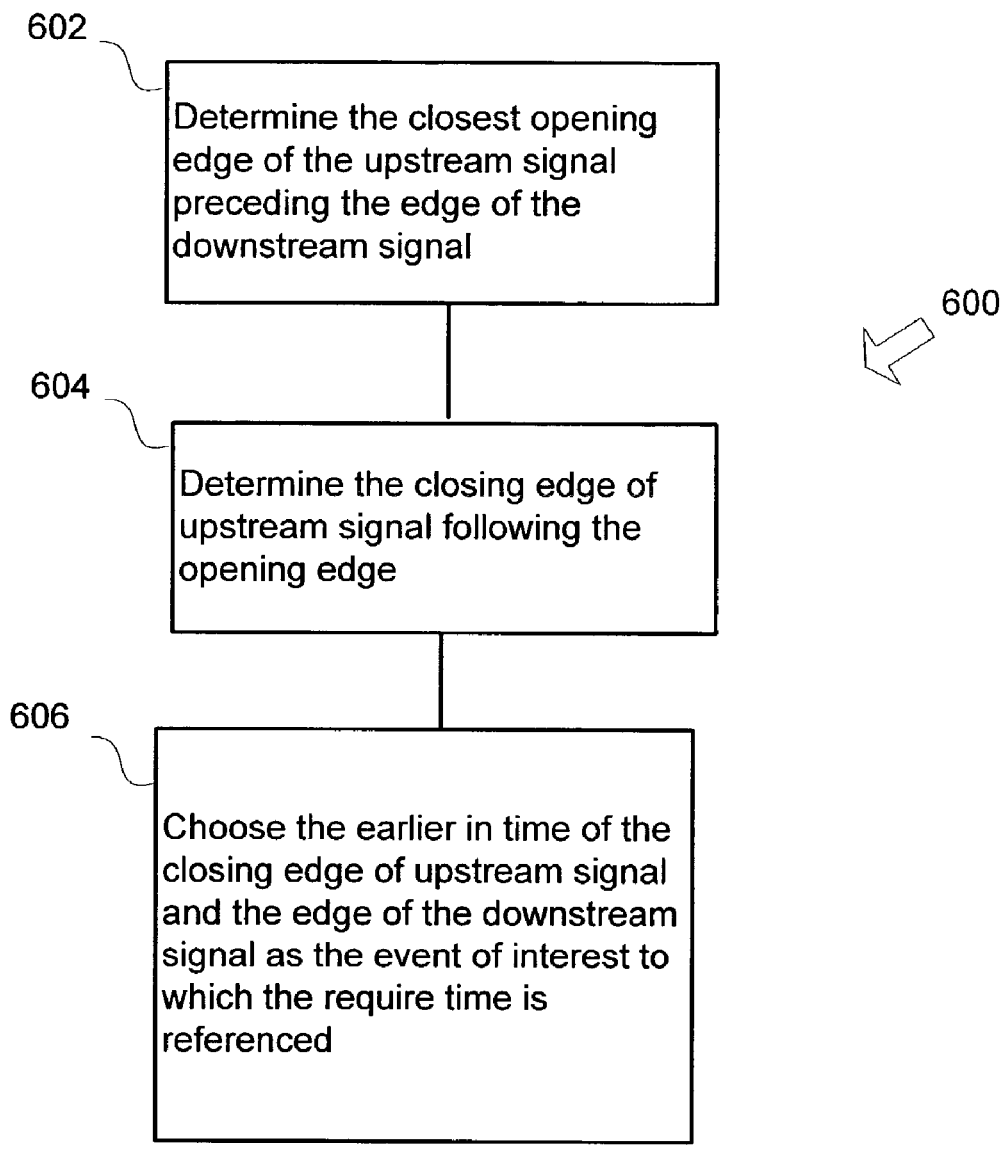
FIG. 6 is a flow chart of a method embodiment to locate corresponding edges of periodic signals.

This process is illustrated in flow chart form in FIG. 6. At 602 the closest opening edge of the upstream signal preceding the edge of the downstream signal is selected. At 604 the closing edge of the upstream signal following this opening edge is determined. At 606 the earlier in time of the closing edge of the upstream signal and the edge of the downstream signal is chosen as the event of interest upon which the required time at a point is referenced.

When there are multiple relationships between the edges of Clock2 and Clock3, the two signals are walked using the process described previously in conjunction with FIG. 4. A required time is determined for the signal S at point D for each possible different relationship between a rising edge of Clock3 and a corresponding rising edge of Clock2. All of these required times are then propagated back along the path, along with a corresponding event to which they are referenced, until the source flip-flop 102 is reached, or until another latch is encountered in the path. For each required time that is propagated back, the corresponding reference event is either the rising edge of Clock3 or the corresponding falling edge of Clock2, whichever is earlier in time. When a second latch is encountered in the path during back propagation of required times, the process described above is repeated.

Figure 7:
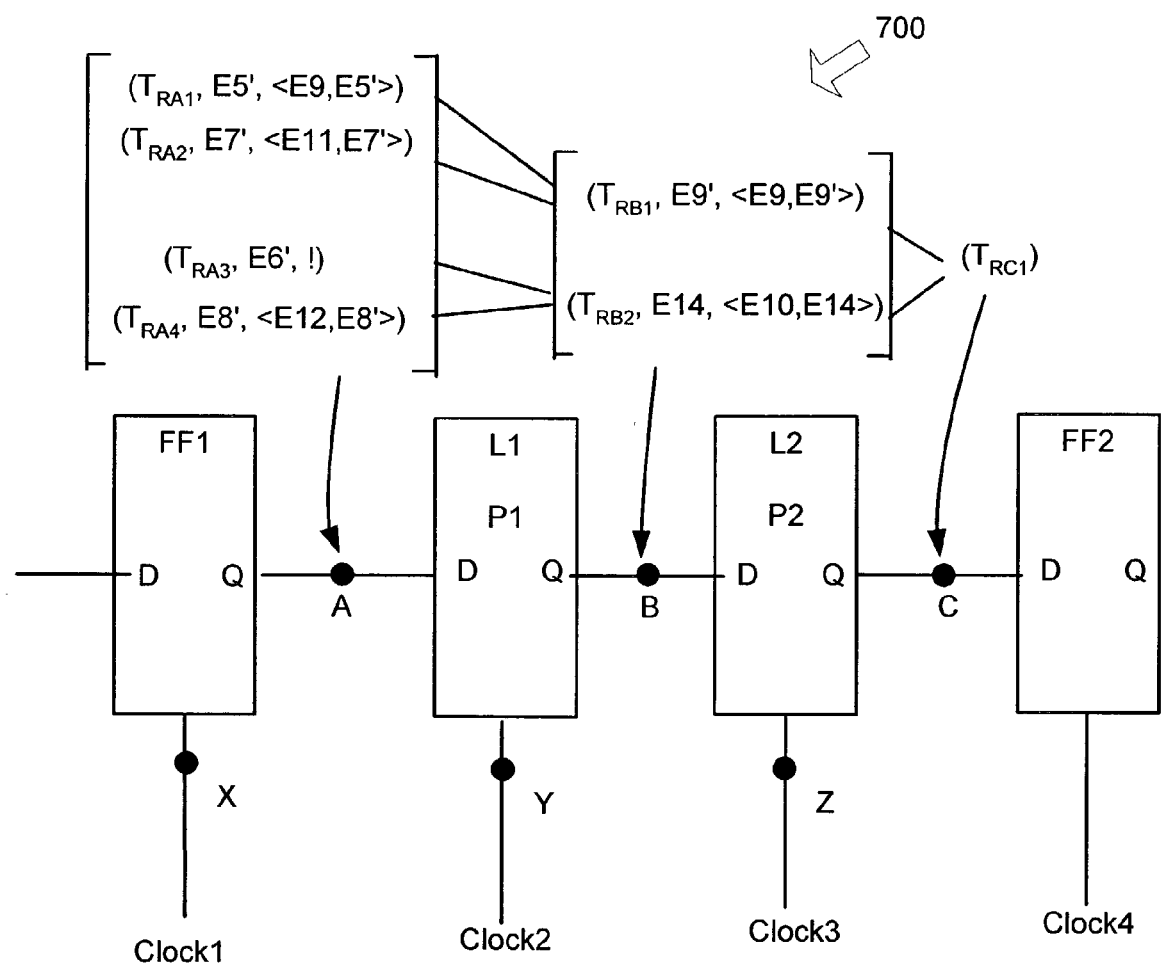
FIG. 7 is a block diagram illustrating a method embodiment to determine required times at points in a circuit design.

With reference to FIG. 7, a circuit embodiment 700 comprises a source flip-flop FF1 having a clock Clock1, a destination flip-flop FF2 having a clock Clock4, and two intervening latches L1 and L2 having clocks Clock2 and Clock3, respectively. To compute the worst-case slack time for the path from FF1 to FF2, a final event of interest is selected. Let us choose, for example, the edge E14 of Clock4. A signal S that arrives at point C must arrive before E14 arrives at the clock terminal of the flip-flop FF2 in order to be stored by the flip-flop FF2. The signal S must arrive at sufficient time before Clock4 to meet the setup time of the flip-flop FF2. To simplify the discussion, the setup times of the circuits will be overlooked, however, in practical applications the required times determined at each point in the circuit would reflect the setup times of the circuit elements.

Figure 8:
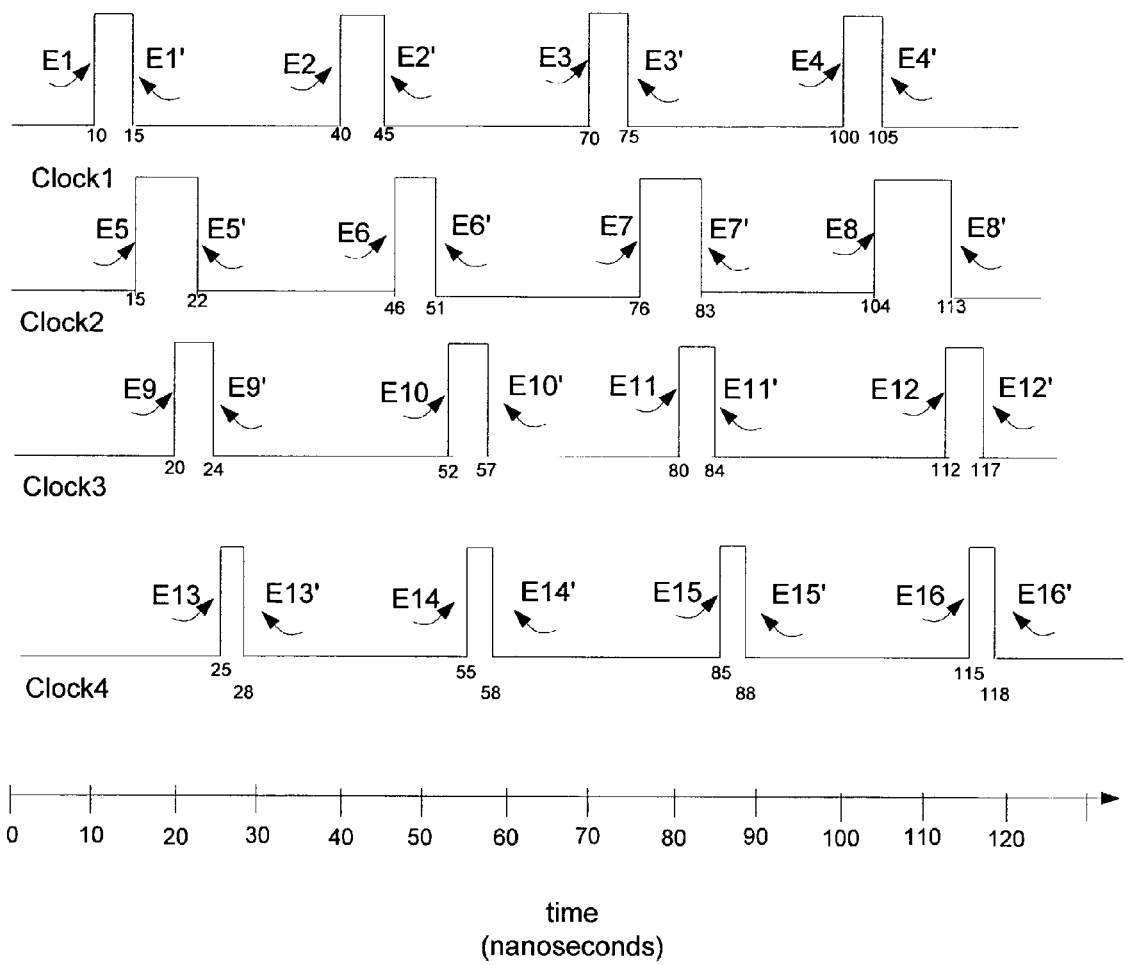
FIG. 8 illustrates embodiments of signals for the circuit design of FIG. 7.

The required time at C is recorded as $T_{RC1}$, e.g. the required time for signal S at point C in the circuit. In practical applications, the setup time of the flip-flop FF2 is factored into $T_{RC1}$, so that for example if the flip-flop FF2 has a 1 nanosecond setup time, $T_{RC1}$ is −1, e.g. 1 nanosecond sooner than the arrival of C4. Working backward along the path, latch L2 is encountered. Latch L2 is clocked by signal Clock3. FIG. 8 shows signal embodiments illustrating possible relationships between Clock1, Clock2, Clock3, Clock4. Clock1 has a period of 30 and rising edges at 10, 40, 70, and 100. Clock1 has falling edges at 15, 45, 75, and 105. Clock2 has a period of 120, with four pulses per period, and rising edges at 15, 46, 76, and 104. Clock2 has falling edges at 22, 51, 83, and 113. Clock3 has a period of 60, with two pulses per period, and rising edges at 20, 52, 80, and 112. Clock3 has falling edges at 24, 57, 84, and 117. Clock4 has a period of 30 and rising edges at 25, 55, 85, and 115. Clock4 has falling edges at 28, 58, 88, and 118.

Referring to the signals Clock3 and Clock4, edge E9 of Clock3 corresponds to (is the closest preceding edge in time) edge E13 of Clock4. In other words, if edge E13 is used to clock the flip-flop FF2, then edge E9 is presumed to be the edge that will open the preceding latch L2. Edge E10 of Clock3 corresponds to edge E14 of Clock4. The other edges of Clock3 and Clock4 have the same relationship (e.g. the same relative timing) as edges E9/E13 and E10/E14. Thus, the signals Clock3 and Clock4 have two possible relationships. The "virtual period" of the two clock signals Clock4 and Clock3 is determined as the least common multiple of the clock periods of the two signals. In this case, the virtual period is 60.

Referring back to FIG. 7, two required times are recorded for point B in the circuit 700, one required time for each possible relationship between the signals Clock3 and Clock4. The required times at point B are determined using the D-Q propagation delay of the intervening latch. A first required time entry $T_{RB1}$ is recorded for point B. Using the ping-pong approach, a reference event, in this case E9', is associated with this required time relative to E13 (because required times are only significant in relation to some event). The interval <E9, E9'> is also associated with the required time and like the required time is made relative to the reference event (e.g. the start and stop times of the interval are each made relative to the time of the reference event E9'). The purpose of recording the latch open interval with the required time will be explained subsequently.

A second required time entry $T_{RB2}$ is recorded for point B. Using the ping-pong approach, a reference event, in this case E14, is associated with this required time relative to E14. The interval <E10, E14> is also associated with the required time and like the required time is made relative to the reference event. The interval, as one will recall from FIG. 6, is <E10, E14>, not <E10, E10'>, because E14 occurs at 55 ns and E10' occurs at 57 ns.

The set of reference edges at a point in a path may be referred to as a "virtual clock edge list" at the point in the path.

As the preceding example illustrates, in one embodiment of a method to determine slack times of a circuit, the reference event for required times at a point preceding a latch is a closing edge of the latch clock signal when the latch closes prior to the occurrence of the corresponding downstream event.

Next, required times are determined for point A, based upon the required times determined for point B. The latch L1 is clocked by signal Clock2. The edges of Clock2 have four possible relationships with the set of reference signals determined at point B. The required times associated with the reference edges E5', E6', E7', and E8' are the ones that would have been originally from edges E13, E14, E15, and E16 respectively. The virtual period of the signals comprising the reference edges at point B is 60. The required time $T_{RB1}$ at point B is referenced to the edge E9' of signal Clock3. A required time $T_{RA1}$ at point A, corresponding to the required time $T_{RB1}$ at point B, is determined by adjusting the required time $T_{RB1}$ to be relative to the reference edge at point A. Edge E5' is chosen as the reference edge at point A using the ping-pong approach. Thus if the required time $T_{RB1}$ at E9' is 1, the required time $T_{RA1}$ at E5' is 3, because E9' occurs at 24, two nanoseconds later than E5' at 22. An interval <E9',E5'> is associated with $T_{RA1}$, representing the composite (overlap) of the latch open intervals <E9,E9'> and <E5,E5'>. (e.g. the overlap of the open intervals of all latches downstream from point A along the path). Actual delays in the circuit are taken into account in adjusting the latch open interval <E9,E9'> before finding the overlap with interval <E5,E5'>(this simplified example ignores the delays). Also, both of the intervals are made relative to the new reference edge E5' before determining the overlap. The purpose of the composite open interval will be covered more fully in the determination of slack times.

Likewise, a required time $T_{RA2}$ is recorded at point A, corresponding to the required time $T_{RB1}$ plus one virtual period of the signals comprising the reference edges at point B. One virtual period (60) was added to the reference edge E9' to determine the corresponding reference edge E11' from the next virtual period of Clock3. Using the ping-pong approach, the reference event is set to E7'. A composite open interval <E11,E7'> is associated with $T_{RA2}$, representing the overlap of the latch open intervals <E11,E11'> and <E7, E7'>. Adjustments for circuit delay are made in the manner described above. The intervals are made relative to the same reference edge, as described above.

The required time $T_{RA3}$ at point A represents a third relationship between the edges of Clock2 and Clock3. Applying the ping-pong approach to the reference edge E14 for $T_{RB2}$, the reference event for $T_{RA3}$ is set to E6'. There is no interval of time during which the open intervals <E10, E10'> and <E6,E6'> overlap (assume for the purpose of this description that this is true, even after adjusting for circuit delay and making the intervals relative to E6'). Thus the composite open interval is set to undefined (!).

A fourth required time $T_{RA4}$ is recorded at point A, corresponding to the required time $T_{RB3}$ plus one virtual period of the signals comprising the reference events at point B. Applying the ping-pong approach to edge E16 (E14 plus one virtual period), the reference event for $T_{RA4}$ is determined to be E8'. A composite open interval <E12,E8'> is associated with $T_{RA4}$, representing the overlap of the latch open intervals <E12,E12'> and <E8,E8'>. Again, circuit delays are ignored, and the intervals are made relative to E8' in determining the overlap.

Eventually, the source flip-flop FF1 or other origination point of the path is reached. The signal Clock1 is the clock signal for flip-flop FF1. For each required time at point A, a corresponding arrival time is determined at point X, where Clock1 is received. Where the edges of the signal Clock1 have multiple relationships with the virtual clock edge list, a particular required time entry at point A may give rise to multiple arrival time entries at point X. Edges of Clock1 are chosen that immediately precede each of the required times. In this manner, each back propagated required time and event of interest is associated with a source event of interest at the starting point of the path. Each required time is associated with one or more starting events of interest. If the number of starting events of interest is greater than one, then the relationship of one or more virtual periods is different with respect to the source clock.

The source events of interest identified in this fashion may then be propagated downstream along the path. Any uncertainty in the arrival time of a source event at point X is accounted for as an interval (T1, T2) of potential arrival times for the source event, where T1 is the earliest possible arrival time for the event, and T2 is the latest possible arrival time for the event.

Arrival times for the source events of interest at various points downstream are determined by adding propagation delays of the elements encountered by the events as they propagate downstream. Each element can have a minimum and maximum propagation delay. The arrival ranges are "widened" according to the maximum propagation delay of the elements encountered. To widen a range, T1 is increased by the minimum propagation delay of the element, and T2 is increased by the maximum propagation delay of the element.

Figure 9:
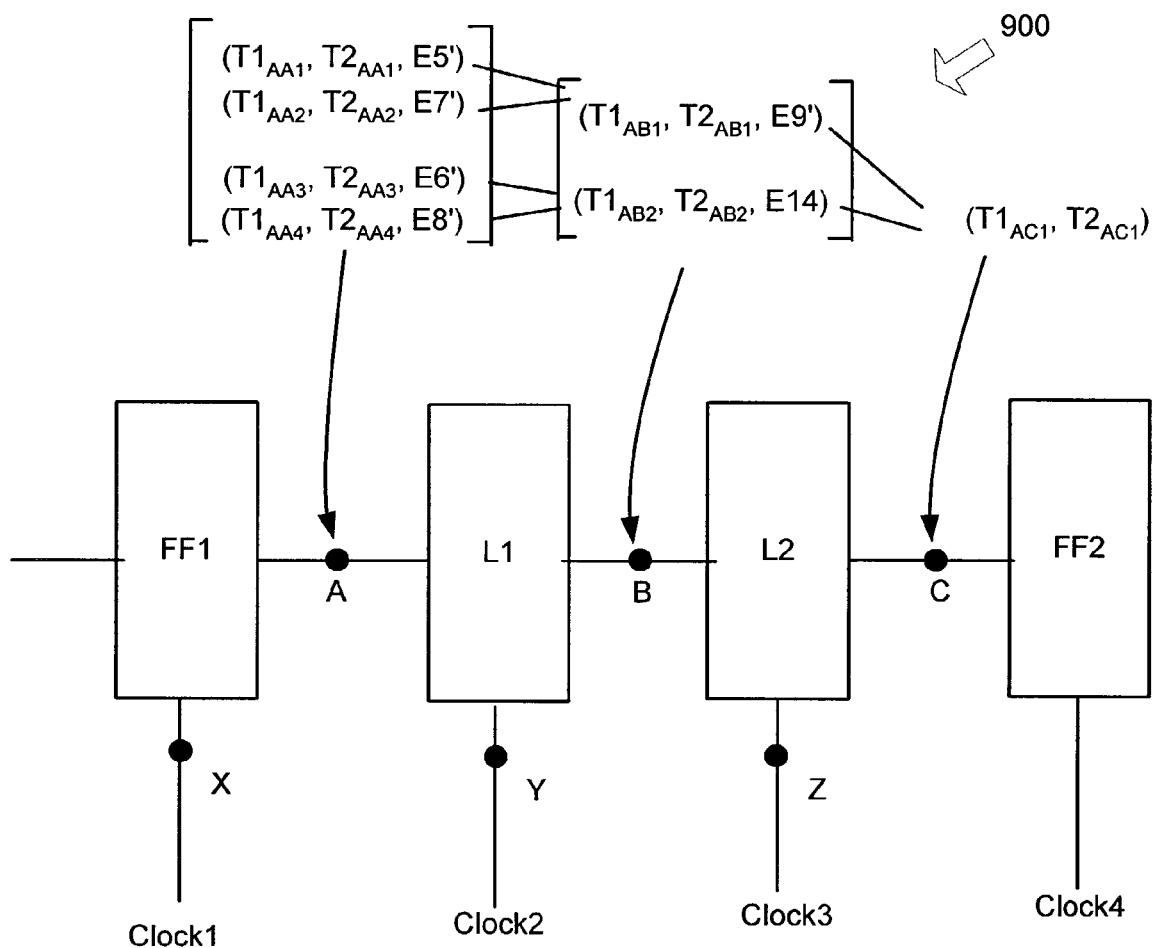
FIG. 9 is a block diagram illustrating a method embodiment to determine arrival times at points in the circuit design of FIG. 7.

When a latch is encountered during propagation of arrival times downstream, entries may be merged to determine the arrival time entries at the next downstream point after the latch. Referring to FIG. 9, at point A there are four arrival time entries, each corresponding to a required time entry from FIG. 7. The arrival time entry ($T1_{AA1}$, $T2_{AA1}$, E5') corresponds to the required time entry ($T_{RA1}$, E5', <E9, E5'>); the arrival time entry ($T1_{AA2}$, $T2_{AA2}$, E7') corresponds to the required time entry ($T_{RA2}$, C4', <E11,E7'>); and so on. Upon encountering a latch during propagation downstream, arrival time entries corresponding to required time entries with a common parent are merged to create an arrival time entry at the next downstream point after the latch. Thus the two arrival time entries ($T1_{AA1}$, $T2_{AA1}$, E5') and ($T1_{AA2}$, $T2_{AA2}$, E7') at point A are merged to create the arrival time entry at point B, ($T1_{AB1}$, $T2_{AB1}$, E9'). The value $T1_{AB1}$ is determined as the minimum of $T1_{AA1}$ and $T1_{AA2}$. The value $T2_{AB1}$ is determined as the maximum of $T2_{AA1}$ and $T2_{AA2}$. Before merging, the arrival time intervals are made relative to (referenced to) the reference event of the corresponding parent event. Thus, the values $T1_{AB1}$ and $T2_{AB1}$ are adjusted so that they are relative to edge E9' before performing the merge. Making the times relative to E9' involves an adjustment (in the case of arrival times $T1_{AA1}$ and $T2_{AA1}$ relative to E5', adding or subtracting the difference between E5' and E9') and a translation (in the case of the arrival times $T1_{AA2}$ and $T2_{AA2}$ relative to E7', making them relative to E11'). Thus the arrival range relative to E9' represents the range of all possible arrivals that could arrive relative to E9' or any clock edge related to E9' by the virtual clock period at point B.

The interval ($T1_{AB1}$, $T2_{AB1}$) is widened according to the minimum and maximum propagation delays of the latch L1. The interval ($T1_{AB1}$, $T2_{AB1}$) is "clipped" according to the relevant open interval of the latch L1. Clipping involves finding the overlap of the two intervals. When the reference event is edge E9', the corresponding open interval of latch L1 is <E5,E5'>. When the reference event is edge E14, the corresponding open interval of latch L1 is <E6,E6'>.

Likewise, the two arrival time entries ($T1_{AA3}$, $T2_{AA3}$, E6') and ($T1_{AA4}$, $T2_{AA4}$, E8') at point A are merged and adjusted to create the arrival time entry at point B, ($T1_{AB2}$, $T2_{AB2}$, E14).

A situation may arise where the arrival interval and the open interval of the latch do not overlap. If the arrival interval ends before the open interval begins, the signal S always hits a red light at the latch. In this case, the path from point X is ended at point A, and a new path is started from point Y. The source events of interest for this new path are the edges of the clock signal Clock2.

If the arrival interval begins before the open interval begins, but ends during or after the open interval, the signal S may hit a red light at the latch. In this case, the path from point X is ended at point A, and an identical path from point X is continued on through the latch (using the CK-Q propagation delay of the latch). Another path is started from point Y. The source events of interest for this new path are the edges of the clock signal Clock2. Slack times for the path ending at A are determined relative to the closing edge of the latch clock, providing a slack value that is relevant for the path up to that latch but not beyond.

In one embodiment, arrival entries will be recorded at X only for those edges of Clock2 resulting in red-light conditions at point A. For example, if there are 6 different clock relationships between the latch clock and the clocks comprising the reference events at a latch, if only on the fifth relationship involves a red-light situation, then an arrival entry and a path from the latch clock terminal to the latch output terminal will be produced only for that fifth relationship. In other words, for each reference event at the data terminal of a latch, a decision is made as to whether or not to begin a new path at the clock terminal of the latch. If an arrival entry gives rise to a red light situation, paths are started from the clock terminal of the latch and proceeding downstream through the design for each arrival at the latch clock terminal that gives rise to a red light situation. Other arrivals at the clock terminal do not give rise to new paths.

A "period offset" may be included with the arrival entries. The period offset associated with an arrival entry indicates which period of the virtual clock for the reference event comprised by the arrival entry had the earliest arrival time. When arrival entries are merged into a parent entry upon crossing a latch, the period offset indicates from which virtual period of the reference event the red-light situation arose. The period offset is increased appropriately when merging arrival entries. When a path is started at a latch clock terminal, the period offsets there are set based on the period offsets of the arrival entries at the latch data terminal that gave rise to the red light condition. The period offset is used when a path is started at the clock pin of a latch to begin the path an appropriate number of iterations of the virtual period out to correspond with the red light arrival.

When the arrival interval falls completely within the open interval of the latch, the path from point X is ended at point A, and an identical path from point X is continued on through the latch (using the D-Q propagation delay of the latch).

If the arrival interval begins after the open interval ends, the signal S never gets through the latch on time to meet the timing requirements of the circuit. In this case, the path from point X is ended at point A, and the timing failure is recorded.

In this case a new path may be started at the output terminal of the latch. The circuit designer may examine this path to ascertain what would be the worst case slack from the latch output terminal to the final event of interest.

In one embodiment, each arrival entry may also comprise a minimum late value and a maximum early value. These values may be applied to ascertain when to start a path at the latch clock terminal or the latch output terminal in situations where multiple signals merge coming to the input terminal of the latch.

Returning to the example of FIG. 9, the two arrival time entries at point B are merged to create the arrival time entry at point C, ($T1_{AC1}$, $T2_{AC1}$). The interval ($T1_{AC1}$, $T2_{AC1}$) is widened according to the minimum and maximum propagation delays of the latch L2. The interval ($T1_{AC1}$, $T2_{AC1}$) is "clipped" according to the relative open interval of the latch L2. Paths are terminated at point B, and new paths created, according to the same process specified for point A.

Figure 10:
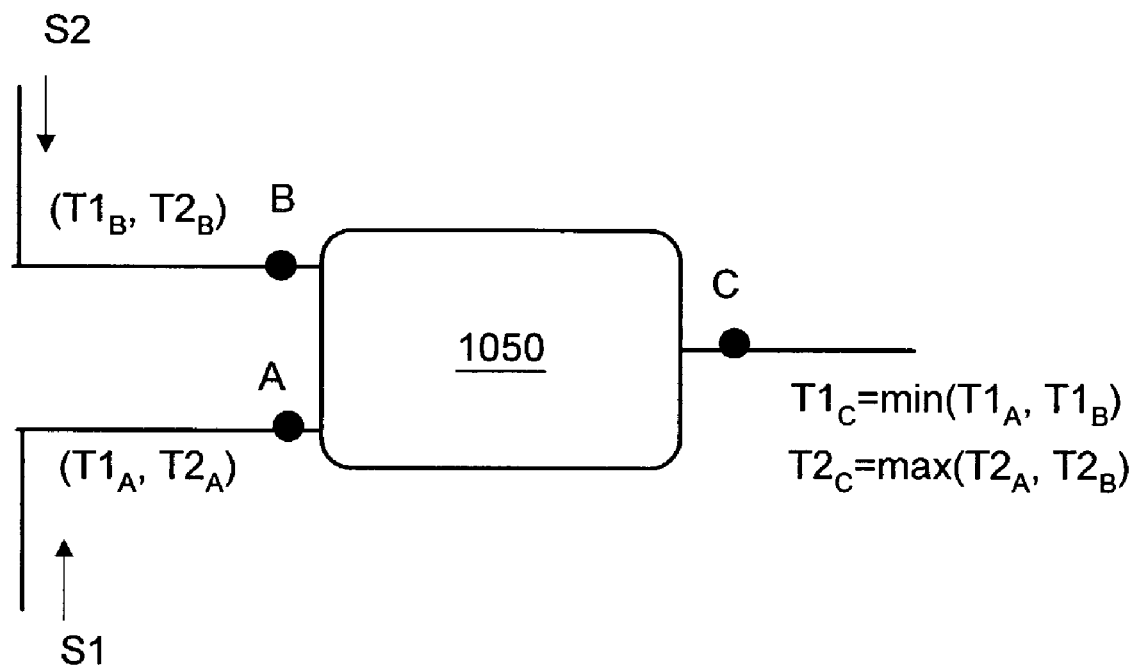
FIG. 10 illustrates a circuit element wherein signals are merged.

Another situation that can occur is where two or more paths merge at a circuit element. Referring to FIG. 10, a circuit element 1050 has two inputs having points A and B, respectively. Signals S1 and S2 arrive at points A and B, respectively. Arrival intervals ($T1_A$, $T2_A$) and ($T1_B$, $T2_B$) are determined for signals S1 and S2 at points A and B, respectively. One of these intervals is referenced to the reference event of the other, each interval is adjusted for the corresponding propagation delay through the element 1050 (A to C delay and B to C delay), and then the two intervals are merged to produce the arrival interval ($T1_c$, $T2_c$) at point C.

Figure 11:
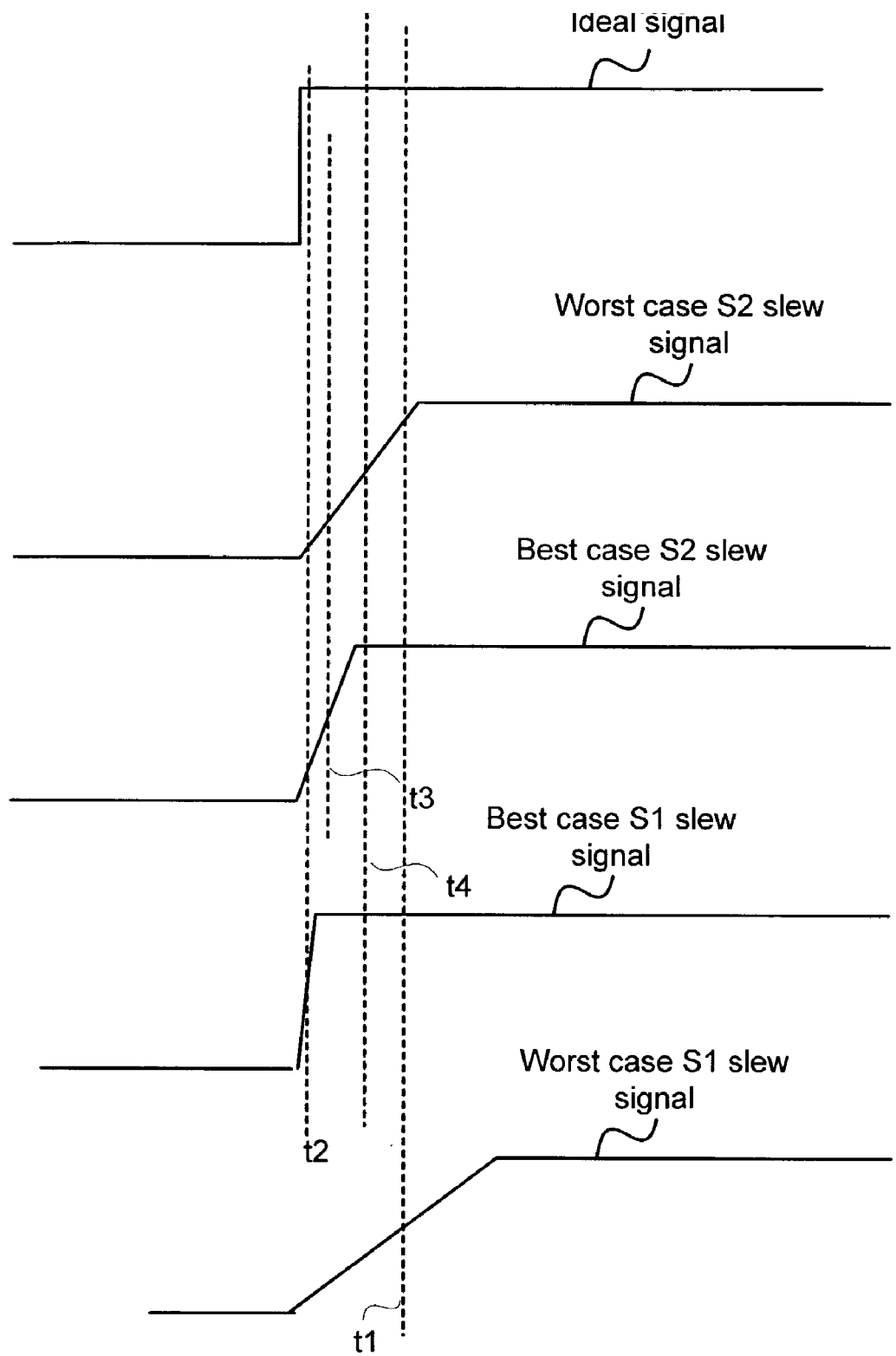
FIG. 11 illustrates embodiments of an ideal signal and slewed signals.

Referring to FIG. 11, signals S1 and S2 each have a best-case and worst-case slew time. Assuming that a signal transition is complete when the signal crosses the midpoint of its low-high range, then the rising edge of signal S1 occurs, in the worst case, at time t1 and in the best case at time t2. The rising edge of signal S2 occurs, in the best case, at time t3 and in the worst case at time t4. To merge the arrival intervals of these two signals, the delay range from A to C is calculated using the best and worst case slews for signal S1. The delay range from B to C is calculated using the best and worst case slews for signal S2. The two delay ranges are merged to determine the arrival ranges of the signal at C. The slew range of the merged signal is set to the worst-case slew of signal S1 (which is worse than the worst case slew of signal S2).

Figure 12:
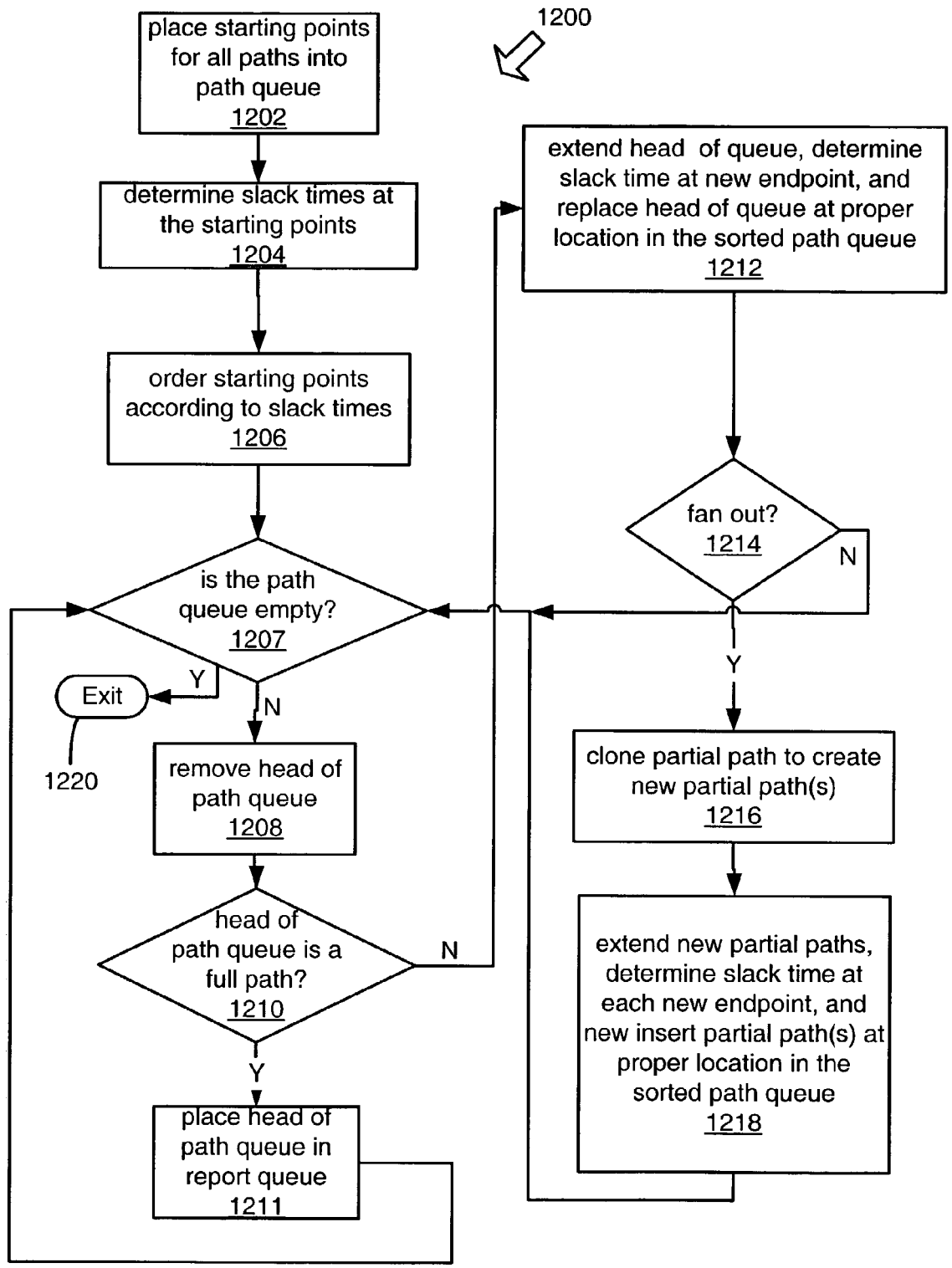
FIG. 12 is a flow chart of an embodiment of a method to perform slack analysis on a circuit design.

Once required and arrival times are determined for all paths through the circuit, a list of paths having the worst-case slack times for a given point may be reported. FIG. 12 shows a method embodiment 1200 for reporting paths with worse-case slack time in a circuit. At 1202 the starting points for all paths through a circuit are added to a priority path queue. A priority queue is an ordered collection. A particular point may be the starting point for multiple paths. A starting point may comprise multiple sets of required and arrival times determined according to the preceding analysis. Starting points are added for the rising and falling edges of the signal to trace through the design.

At 1204 slack times are determined at each starting point according to the required time and arrival time entries. When a path is started, an arrival time for each possible clock relationship is carried from the source clock all the way through the pipeline of latches. Each of these arrivals is updated appropriately as the path is extended. Each arrival can be compared with a required time at the current end point of the path by an appropriate adjustment. By examining each arrival as it passes through a latch, it can be determined whether or not the late value will pass through the latch. If so, the path continues. If not, the path is left undefined. The worst-case of the slack times determined in this fashion is the slack time of the path.

Once slack times for all points are determined, the queue is ordered at 1206 according to slack time. Alternatively, the queue could be "self-ordering", so that as paths are added, the queue reorders itself so that it is always ordered according to the slack time of its constituent paths. The path with the lowest (worst-case) slack time is placed at the head of the queue. The slack time of paths increases from the head of the path queue to the tail of the path queue.

At 1208 the path at the head of the path queue (the path having the worst slack time) is removed from the path queue. A check is made to determine if this path is a complete path, e.g. if it has been extended to its ending point. If so, the path is "reported" by moving it to the report queue at 1210. This report queue is provided to the circuit designer and is self-ordering; that is, the first path moved to the report queue has the worst slack, the next path moved to the report queue has the second worst slack, and so on. Processing may stop once a number of worst case slack paths, as specified by the circuit designer, are reported.

Figure 13:
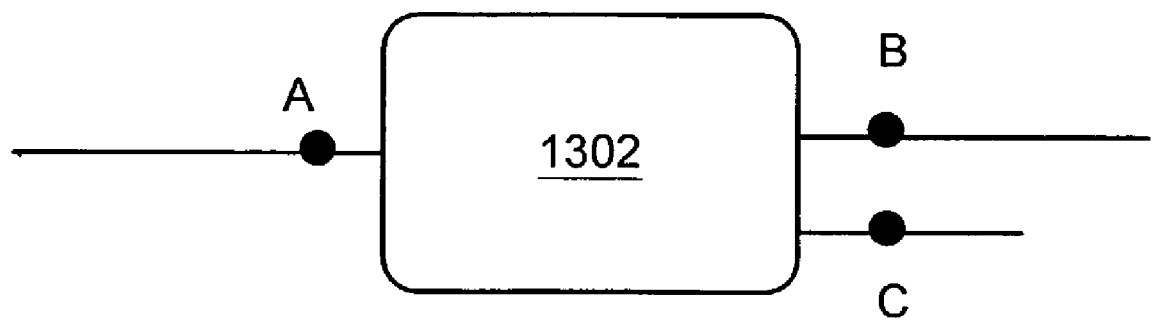
FIG. 13 illustrates a circuit element wherein fan out takes place.

If, at 1214, extending a path would result in "fan out", the path is cloned at 1216 to create one or more new paths proportional to the amount of fan-out. FIG. 13 shows an example of a fan out situation. A circuit element 1302 has a single input and two outputs. When a path is extended from point A, a fan out occurs so that the output signal of the circuit 1302 is provided at both points B and C. In this situation, the path is cloned (the path information is duplicated) to create one new, identical path. The existing path is extended from point A to point B, and the new path is extended from A and C. At 1218 slack times are computed at the end points of the paths and the paths are inserted into the path queue at the proper location, e.g. placed such that the ordering of the queue is maintained.

As paths are extended, the arrival ranges are adjusted according to the actual slew times of the signals. At the data terminal of a latch, each arrival range is examined to determine if the latest arrival time for the range falls within the open interval of the latch. If it does, the path is extended though the latch. Otherwise, the path is left undefined.

Referring again to FIG. 12, the method then returns to 1208 to repeat, as long as the path queue is not empty, until a predetermined number of completed paths are removed to the report queue. This provides the circuit designer with a predetermined number of worst-case slack paths through the circuit.

Figure 14:
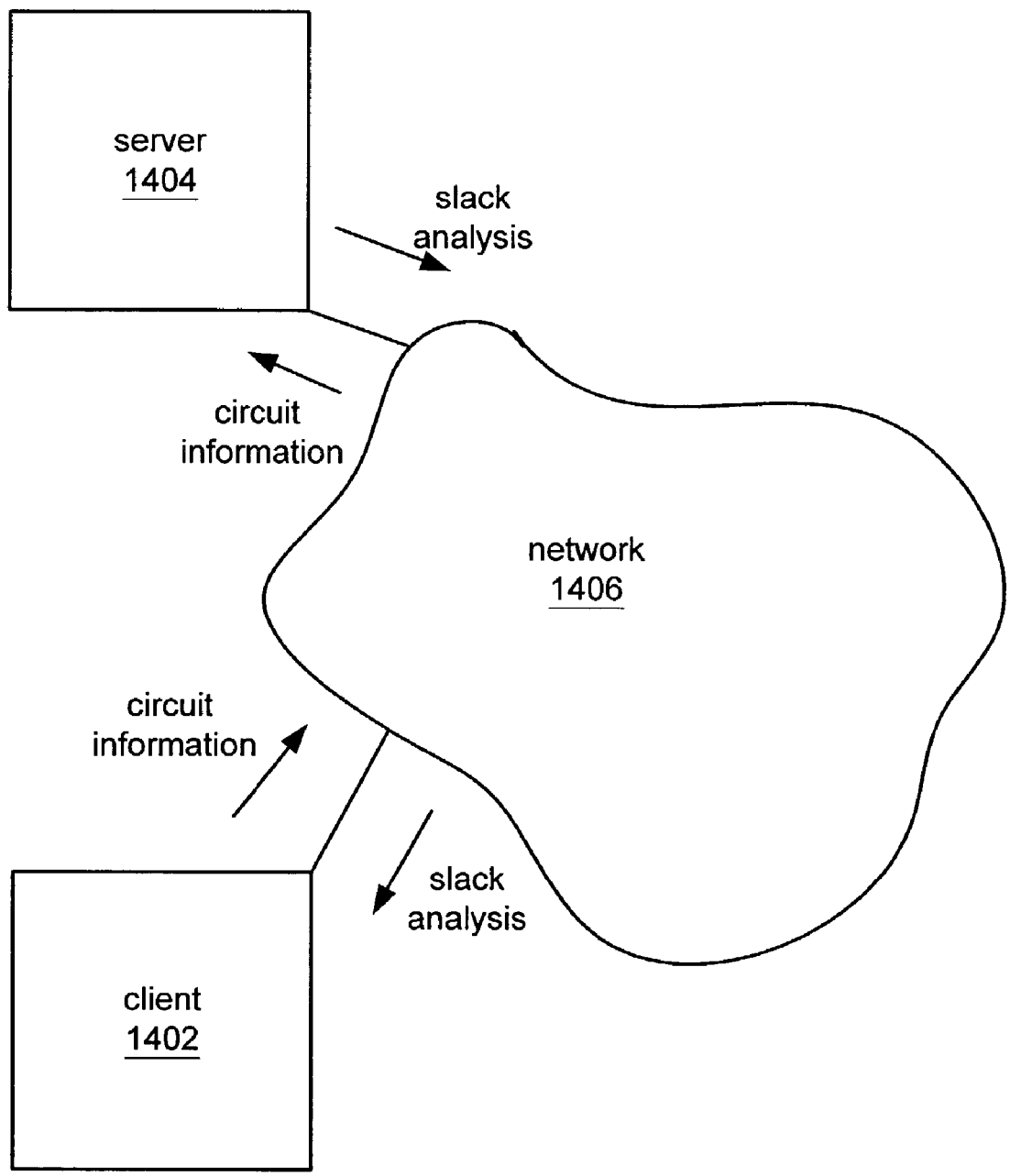
FIG. 14 is a block diagram of an embodiment of a network environment for performing slack time analysis of a circuit design.

With reference to FIG. 14, information comprising a circuit design may be communicated from a client device 1402 to a server device 1404 via a network 1406. The network 1406 may comprise various technologies, including switches, routers, and computers of the Internet, the public phone network, and private collections of computers (socalled "intranets"). Optical, electrical, and wireless communication technologies may be employed, among other things. The client 1402 may be any processing device capable of storing and communicating information, such as a desktop computer, workstation, laptop computer, handheld computer, and so on. The server 1404 is any device comprising a process and memory that provides processing and/or data in response to requests from the client 1402. Often, the server 1404 is some form of powerful computer system. The server 1404 may perform processing on the circuit information provided by the client 1402 and may communicate a resulting slack analysis to the client 1402.

Figure 15:
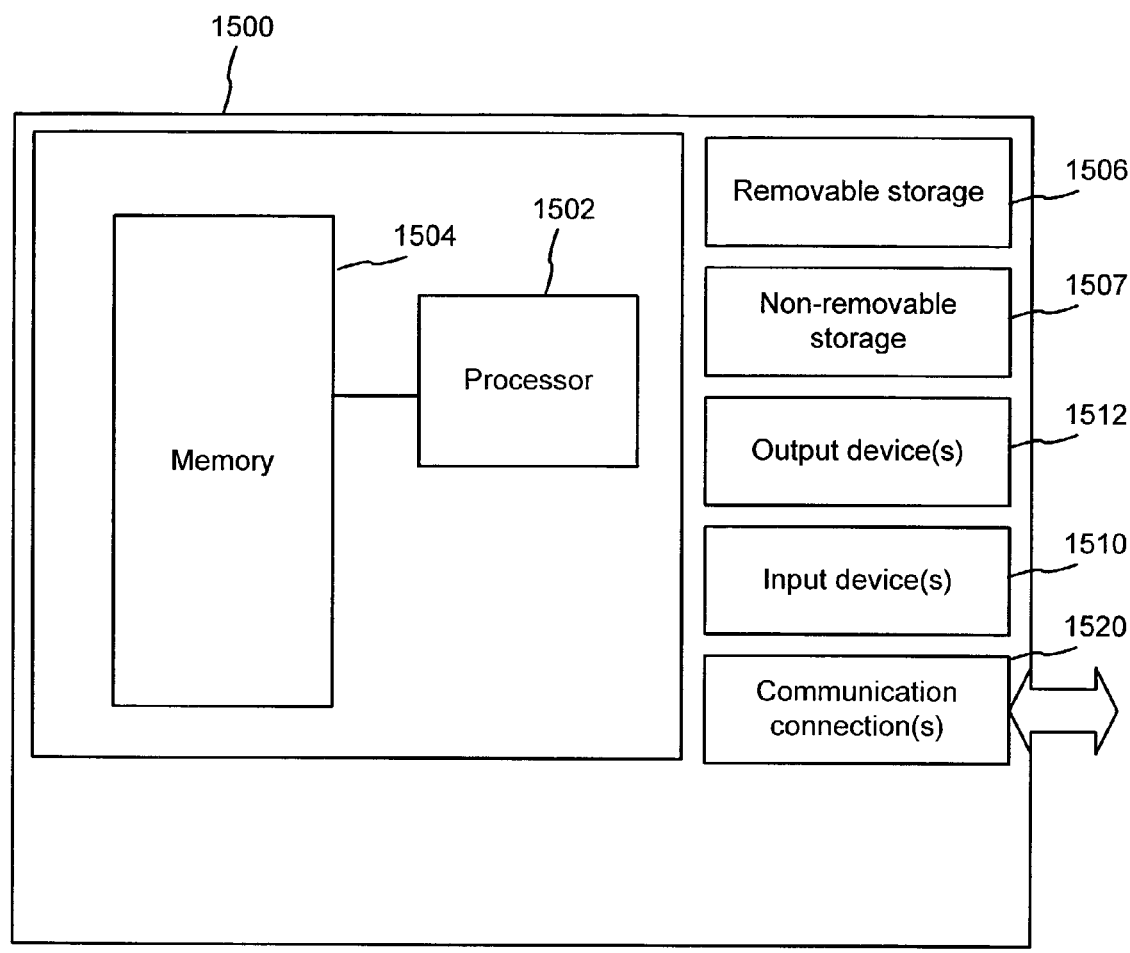
FIG. 15 is a block diagram of an embodiment of a system to carry out methods in accordance with the present invention.

With reference to FIG. 15, an apparatus embodiment 1500 for practicing embodiments of the present invention comprises a processing unit 1502 (e.g., a processor, microprocessor, micro-controller, etc.) and machine-readable media 1504. The apparatus may is an embodiment of a "computer system", although in general a computer system can be any device comprising a processor and a memory, the memory to store instructions to supply to the processor for execution. Depending on the configuration and application (mobile, desktop, server, etc.), the memory 1504 may be volatile (such as RAM), non-volatile (such as ROM, flash memory, etc.) or some combination of the two. By way of example, and not limitation, the machine readable media 1504 may comprise volatile and/or nonvolatile media, removable and/or non-removable media, including: RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information to be accessed by the apparatus 1500. The machine readable media 1504 may be implemented in any method or technology for storage of information such as computer readable instructions, data structures, program modules or other data. Such instructions and data may, when executed by the processor 1502, carry out embodiments of methods in accordance with the present invention.

The apparatus 1500 may comprise additional storage (removable 1506 and/or non-removable 1507) such as magnetic or optical disks or tape. The apparatus 1500 may further comprise input devices 1510 such as a keyboard, pointing device, microphone, etc., and/or output devices 1512 such as display, speaker, and printer. The apparatus 1500 may also typically include network connections 1520 (such as a network adapter) for coupling to other devices, computers, networks, servers, etc. using either wired or wireless signaling media.

The components of the device may be embodied in a distributed computing system. For example, a terminal device may incorporate input and output devices to present only the user interface, whereas processing component of the system are resident elsewhere. Likewise, processing functionality may be distributed across a plurality of processors.

The apparatus may generate and receive machine readable instructions, data structures, program modules or other data in a modulated data signal such as a carrier wave or other transport mechanism. The term "modulated data signal" means a signal that has one or more of its characteristics set or changed in such a manner as to encode information in the signal. This can include both digital, analog, and optical signals. By way of example, and not limitation, communication media includes wired media such as a wired network or direct-wired connection, and wireless media such as acoustic, RF, infrared and other wireless media. Communications media, including combinations of any of the above, should be understood as within the scope of machine readable media.

Particular embodiments of a method and apparatus to perform slack analysis on a circuit design have been described herein. Many alternative embodiments will now become apparent to those skilled in the art. It should be recognized that the described embodiments are illustrative only and should not be taken as limiting in scope. Rather, the present invention encompasses all such embodiments as may come within the scope and spirit of the following claims and equivalents thereto.

What is claimed is:

1. A method for determining a slack time for a node in a circuit design comprising:
    determining a starting point and an ending point for a path going through at least one latch;
    determining a set of required times for each node in the path by working upstream from the ending point,
    determining a respective set of arrival times for the one or more nodes in the path by working downstream from the starting point; and
    calculating the slack time for the one or more nodes in the path from the respective set of required times and the respective set of arrival times at each respective node,
    wherein the required times in the respective set of required times and the arrival times in the respective set of arrival times are associated with different clock relationships between the respective node and a downstream node, the different clock relationships resulting from the respective node and the downstream node being driven by different respective clock signals, at least one of the respective clock signals having a varying pulse width.

2. The method of claim 1, wherein determining the set of required times includes determining an open interval indicating when a signal at that point may make it all the way to a path endpoint without hitting a closed latch.

3. The method of claim 1, wherein determining the set of required times includes propagating a set of open intervals and the set of required times upstream through combinational logic and open latches.

4. The method of claim 1, wherein calculating the slack time for one or more nodes comprises:
    taking the difference between a required time and an arrival time for each pair of arrival and required times at a node to create a slack time for each pair, where the required time and the arrival time have a common clock reference;
    finding a worst slack time for the node by finding the worst of the slack times for all of the pairs of arrival and required times for the node; and
    using the worst slack time of the node as the slack time for the node.

5. The method of claim 1, wherein determining the respective set of required times includes merging multiple sets of required times having identical reference clock edges when propagating back through a fan out.

6. The method of claim 1, wherein determining the set of required times includes determining a set of reference clock edges at the input data (D) pin of a latch that represents all possible clock relationships from the latch to the ending point.

7. The method of claim 6, wherein the latch is the first latch encountered while propagating upstream from the ending point and the reference clock edge for that latch is one edge from a set of edges comprising all of the different clock relationships between the latch clock and the ending point clock.

8. The method of claim 6, wherein the latch is not the first latch encountered while propagating upstream from the ending point and the reference clock edge for that latch is one edge from a set of edges comprising all of the different clock relationships between the latch clock, all preceding latch clocks, and the ending point clock.

9. The method of claim 6, further comprising:
determining a required time for each reference clock edge in the set of reference edges to create the respective set of required times.

10. The method of claim 1, wherein determining the respective set of arrival times includes propagating an arrival interval and a period offset value downstream through combinational logic.

11. The method of claim 10, wherein the arrival interval comprises the time window bounded by the earliest and latest possible arrival times.

12. The method of claim 10, wherein the period offset value comprises an index relative to the virtual clock indicating which period has the earliest arrival time.

13. The method of claim 1, wherein determining the set of arrival times includes determining an arrival interval that corresponds to each required time.

14. The method of claim 13, further including determining a maximum early and minimum late arrival time for each arrival interval.

15. The method of claim 13, further including determining a period offset value for each arrival interval.

16. The method of claim 1, wherein determining the set of arrival times includes folding one or more arrival intervals and clipping them as they propagate from an input data (D) pin of a latch to an output data (Q) of the latch.

17. The method of claim 16, further including updating a period offset value when the arrival times are folded going through the latch.

18. A method for determining a slack time for a node in a circuit design comprising:
determining on a first computer, a starting point and an ending point for a path going through at least one latch;
transmitting the circuit design, the starting point, and the ending point to a second computer;
on the second computer,
determining a respective set of required times for one or more nodes in the path by working upstream from the ending point, each required time in the respective set of required times being associated with a different clock relationship between the respective node and a downstream node, the different clock relationship resulting from the respective node and the downstream node being driven by different clock signals, at least one of which has a varying pulse width,
determining a respective set of arrival times for the one or more nodes in the path by working downstream from the starting point, each arrival time in the respective set of arrival times being associated with a corresponding one of the different clock relationships, and
calculating the slack time for each node in the path from the respective set of required times and the respective set of arrival times at each node; and
transmitting the slack time for each node from the second computer to the first computer.

19. A method for determining a slack time for a node in a circuit design comprising:
determining a starting point and an ending point for a path going through at least one latch and including the node;
calculating all of the different clock relationships from the node to the ending point, wherein the different clock relationships arise from at least two different clock signals, and wherein at least two of the different clock signals have different periods;
determining a reference clock edge for each clock relationship, where the reference clock edge is any edge of the clock at the ending point if the node is the first latch upstream of the ending point, or, if not, the reference clock edge is a specific clock edge relative to a preceding latch in the path;
determining a required time, which is the last possible time a signal can arrive at the node and still make the timing requirements of the circuit, for each reference clock edge and constructing a set of required times corresponding to the set of reference clock edges;
calculating for each node between the node and the ending point an open interval, which is a window of time where, if a signal arrives at the node during the interval, the signal will travel from the node to the ending point without hitting a closed latch;
calculating an arrival interval, which is a time window stretching from the earliest to the latest possible time that a signal can arrive at a given point, at each node, for each clock relationship, along the path from the starting point to the ending point;
calculating the slack time at each node by taking the difference between a required time and an arrival time for each pair of arrival and required times at a respective node to create a slack time for each pair, where the required time and the arrival time have a common clock reference, and
finding a worst slack time for the node by finding the worst of the slack times for all of the pairs of arrival and required times for the node, and using the worst slack time of the node as the slack time for the node.

20. The method of claim 19, wherein calculating the open interval includes starting at the ending point and working back to the node taking into consideration the effects of combinational logic along the path.

21. The method of claim 19, wherein multiple sets of required times are combined when paths are merged going upstream.

22. The method of claim 19, wherein calculating the arrival interval includes taking into consideration the effects of combinational logic along the path.

23. The method of claim 19, further comprising:
calculating a period offset, which is an index into a virtual clock indicating which period of the virtual clock the earliest arrival time of the set of arrival times occurs, at each node along the path from the starting point to the ending point, including the node where the slack time will be calculated, taking into consideration the effects of combinational logic along the path.

24. The method of claim 19, further comprising:
determining a maximum early arrival time, which is the latest early arrival time from a set of arrival intervals, for each arrival interval set.

25. The method of claim 19, further comprising:
determining a minimum late arrival time, which is the earliest late arrival time from a set of arrival intervals, for each arrival interval set.

26. The method of claim 19, further comprising:
folding and clipping arrival times as they move through latches.

27. The method of claim 23, further comprising:
updating the period offset value when the arrival times are folded.

28. The method of claim 19, further comprising:
generating one or more paths at a starting point;
extending the paths downstream; and
reporting the paths that go through latches.

29. The method of claim 28, further comprising:
determining whether or not a first path arrives at a latch during the open interval of the latch;
extending the first path to the (Q) pin of the latch if the first path arrived at the (D) pin of the latch during the open interval of the latch; and
generating a second path relative to a specific clock edge starting at the enable pin of the latch if the first path arrives at the (D) pin of the latch before the latch opens.

30. The method of claim 29, wherein the new path is relative to a specific clock edge one or more periods out due to a nonzero period offset value.

* * * * *

UNITED STATES PATENT AND TRADEMARK OFFICE
CERTIFICATE OF CORRECTION

PATENT NO.        : 7,062,734 B2
APPLICATION NO.   : 10/319018
DATED             : June 13, 2006
INVENTOR(S)       : Truman Wesley Collins, Jr.

It is certified that error appears in the above-identified patent and that said Letters Patent is hereby corrected as shown below:

In the Claims:

Column 14, line 14, "a slack time for a node" should read --slack time--.

Column 14, line 18, "determining a set of required times for each node" should read --determining a respective set of required times for one or more nodes--.

Column 14, line 45, "for one or more" should read --for the one or more--.

Column 15, line 22, "to the virtual clock" should read --to a virtual clock--.

Column 15, line 24, "the set" should read --the respective set--.

Column 18, line 4, "to the (Q) pin" should read --to an output data (Q) pin--.

Column 18, line 5, "at the (D) pin" should read --at an input data (D) pin--.

Column 18, line 9, "at the (D) pin" should read --at the input data (D) pin--.

Signed and Sealed this
Thirteenth Day of November, 2012

David J. Kappos
*Director of the United States Patent and Trademark Office*